United States Patent
Chen

(10) Patent No.: US 10,431,561 B2
(45) Date of Patent: Oct. 1, 2019

(54) PRE-CONDUCTIVE ARRAY DISPOSED ON TARGET CIRCUIT SUBSTRATE AND CONDUCTIVE STRUCTURE ARRAY THEREOF

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 0 days.

(21) Appl. No.: 16/137,197

(22) Filed: Sep. 20, 2018

(65) Prior Publication Data
US 2019/0096835 A1    Mar. 28, 2019

(30) Foreign Application Priority Data
Sep. 25, 2017    (TW) .............. 106132805 A

(51) Int. Cl.
*H01L 23/52*       (2006.01)
*H01L 23/00*       (2006.01)
*H01L 23/498*      (2006.01)

(52) U.S. Cl.
CPC ........ *H01L 24/06* (2013.01); *H01L 23/49838* (2013.01); *H01L 24/11* (2013.01); *H01L 24/13* (2013.01); *H01L 24/14* (2013.01); *H01L 24/742* (2013.01); *H01L 24/97* (2013.01); *H01L 24/16* (2013.01); *H01L 24/81* (2013.01); *H01L 2224/0401* (2013.01); *H01L 2224/05568* (2013.01); *H01L 2224/05573* (2013.01); *H01L 2224/06132* (2013.01); *H01L 2224/11003* (2013.01); *H01L 2224/11005* (2013.01); *H01L 2224/11334* (2013.01); *H01L 2224/13007* (2013.01); *H01L 2224/13023* (2013.01); *H01L 2224/13078* (2013.01); *H01L 2224/13082* (2013.01); *H01L 2224/14132* (2013.01); *H01L 2224/16238* (2013.01); *H01L 2224/81192* (2013.01); *H01L 2224/81203* (2013.01); *H01L 2224/97* (2013.01)

(58) Field of Classification Search
CPC ... H01L 23/49838; H01L 24/06; H01L 24/11; H01L 24/13; H01L 24/14; H01L 24/742; H01L 24/97
USPC .......................................................... 257/737
See application file for complete search history.

(56) References Cited

U.S. PATENT DOCUMENTS

| 5,598,036 A * | 1/1997 | Ho ................ H01L 23/49816 257/738 |
| 6,927,491 B1 * | 8/2005 | Yamada ............ H01L 23/49838 257/737 |
| 8,703,600 B2 * | 4/2014 | Migita .................. H01L 24/11 438/108 |

(Continued)

*Primary Examiner* — Luan C Thai
(74) *Attorney, Agent, or Firm* — Muncy, Geissler, Olds & Lowe, P.C.

(57) ABSTRACT

A pre-conductive array disposed on a target circuit substrate comprises a plurality of conductive electrode groups disposed on the target circuit substrate, and at least a conductive particle dispose on each of conductive electrodes of a part or all of the conductive electrode groups. The at least a conductive particle and the corresponding conductive electrode form a pre-conductive structure, and the pre-conductive structures form the pre-conductive array.

20 Claims, 16 Drawing Sheets

(56) References Cited

U.S. PATENT DOCUMENTS 8,791,579 B2 * 7/2014 Lai .................. H01L 23/488
257/738

* cited by examiner

PRE-CONDUCTIVE ARRAY DISPOSED ON TARGET CIRCUIT SUBSTRATE AND CONDUCTIVE STRUCTURE ARRAY THEREOF

CROSS REFERENCE TO RELATED APPLICATIONS

This Non-provisional application claims priority under 35 U.S.C. § 119(a) on Patent Application No(s). 106132805 filed in Taiwan, Republic of China on Sep. 25, 2017, the entire contents of which are hereby incorporated by reference.

BACKGROUND

Technology Field

The present disclosure relates to a target circuit substrate and, in particular, to a target circuit substrate formed with a pre-conductive array.

Description of Related Art

The conventional method to build conductive structures on a target circuit substrate includes: pre-melting conductive pads, solder paste printing, or a SMT (surface mounting technology) process to form the ball grid array (BGA). However, the preciseness of the SMT process is not enough for the micro electronic devices with a size of 100 nm or smaller. The process and device are not matched in technical preciseness.

In addition, the conventional method to build conductive structures may be to coat an anisotropic conductive paste (ACP) on the target circuit substrate. In general, the anisotropic conductive paste having a higher particle fill rate is selected for fitting the target circuit substrate with different distances between the conductive pads or for fitting the target circuit substrate having the conductive pads of different scales. The conductive particles are distributed in three-dimensional inside the coated paste (thermosetting paste or thermoplastic paste), so that it can have the highest possibility to conduct the conductive pads. However, in fact, only a few part of the conductive particles are utilized for conducting the conductive pads, and the residual part (most part) of the conductive particles will be sealed within the paste and thus encapsulated inside the target circuit substrate. Since the material cost of the conductive particles is much higher than the material cost of the pure paste, the above-mentioned application of the anisotropic conductive paste will lead to a great waste of the manufacturing cost. Even if the anisotropic conductive paste with lower particle fill rate can be selected, most of the conductive particles are still be wasted. Thus, the manufacturing cost cannot be effectively reduced. Moreover, since different factories usually have different technical preciseness in the coating process of the anisotropic conductive paste, the thickness of coated paste may be different and the distribution of the conductive particles can also be affected.

SUMMARY

In view of the foregoing, the present disclosure is to provide a pre-conductive array disposed on a target circuit substrate, and conductive structures of a target circuit substrate, which can be widely used without being limited to the scales of the electronic devices to be positioned on the target circuit substrate.

In view of the foregoing, the present disclosure is to effectively dispose a pre-conductive array on a target circuit substrate and the conductive structures thereof.

To achieve the above, the present disclosure provides a pre-conductive array disposed on a target circuit substrate, which comprises a plurality of conductive electrode group and at least a conductive particle. The conductive electrode groups are disposed on the target circuit substrate. A first distance is provided between every two of the conductive electrode groups, and each of the conductive electrode groups comprises at least a pair of conductive electrodes. The conductive particle is dispose on each of the conductive electrodes of a part or all of the conductive electrode groups. The conductive particle and the corresponding pair of the conductive electrodes form a pre-conductive structure, and the pre-conductive structures form the pre-conductive array. A first density is defined to represent a number of the conductive particles within a unit area of each of the pre-conductive structures, a second density is defined to represent a number of the conductive particles within a unit area between two of the pre-conductive structures, and the first density is greater than the second density.

To achieve the above, the present disclosure also provides a pre-conductive array disposed on a target circuit substrate, which comprises a plurality of conductive electrode groups and at least a conductive particle. The conductive electrode groups are disposed on the target circuit substrate. A first distance is provided between every two of the conductive electrode groups, and each of the conductive electrode groups comprises a conductive electrode. The conductive particle is disposed on each of the conductive electrodes of a part or all of the conductive electrode groups. The conductive particle and the corresponding conductive electrode form a pre-conductive structure, and the pre-conductive structures form the pre-conductive array. A first density is defined to represent a number of the conductive particles within a unit area of each of the pre-conductive structures, a second density is defined to represent a number of the conductive particles within a unit area between two of the pre-conductive structures, and the first density is greater than the second density.

To achieve the above, the present disclosure provides a pre-conductive array disposed on a target circuit substrate, which comprises a plurality of pre-conductive structures disposed on the target circuit substrate. Each of the pre-conductive structures comprises a plurality of conductive electrode groups and at least a conductive particle. The conductive electrode groups are disposed on the target circuit substrate. Each of the pre-conductive structures comprises a first number of the conductive electrode groups. Each of the conductive electrode groups comprises at least a pair of conductive electrodes. Each of the conductive electrode groups comprises a second number of the conductive electrodes. The conductive particle is disposed on each of the conductive electrodes of a part or all of the conductive electrode groups. Each of the pre-conductive structures comprises a third number of the conductive particles. A first density is defined to represent a number of the conductive particles within a unit area of each of the pre-conductive structures, a second density is defined to represent a number of the conductive particles within a unit area between two of the pre-conductive structures, and the first density is greater than the second density.

To achieve the above, the present disclosure also provides a pre-conductive array disposed on a target circuit substrate, which comprises a plurality of pre-conductive structures disposed on the target circuit substrate. Each of the pre-conductive structures comprises a plurality of conductive electrode groups and at least a conductive particle. The conductive electrode groups are disposed on the target circuit substrate. Each of the pre-conductive structures comprises a first number of the conductive electrode groups. Each of the conductive electrode groups comprises at least a conductive electrode. Each of the conductive electrode groups comprises a second number of the conductive electrodes. The conductive particle is disposed on each of the conductive electrodes of a part or all of the conductive electrode groups. Each of the pre-conductive structures comprises a third number of the conductive particles. A first density is defined to represent a number of the conductive particles within a unit area of each of the pre-conductive structures, a second density is defined to represent a number of the conductive particles within a unit area between two of the pre-conductive structures, and the first density is greater than the second density.

To achieve the above, the present disclosure provides a pre-conductive array disposed on a target circuit substrate, which comprises a plurality of pre-conductive structures disposed on the target circuit substrate. Each of the pre-conductive structures comprises a plurality of conductive electrode groups and at least a conductive particle. The conductive electrode groups are disposed on the target circuit substrate and distributed in a first array pattern. Each of the conductive electrode groups comprises at least a pair of conductive electrodes distributed in a second array pattern. The conductive particle is disposed on each of the conductive electrodes of a part or all of the conductive electrode groups. The conductive particles are distributed in a third array pattern. A first density is defined to represent a number of the conductive particles within a unit area of each of the pre-conductive structures, a second density is defined to represent a number of the conductive particles within a unit area between two of the pre-conductive structures, and the first density is greater than the second density.

To achieve the above, the present disclosure provides a pre-conductive array disposed on a target circuit substrate, which comprises a plurality of pre-conductive structures disposed on the target circuit substrate. Each of the pre-conductive structures comprises a plurality of conductive electrode groups and at least a conductive particle. The conductive electrode groups are disposed on the target circuit substrate and distributed in a first array pattern. Each of the conductive electrode groups comprises at least a conductive electrode distributed in a second array pattern. The conductive particle is disposed on each of the conductive electrodes of a part or all of the conductive electrode groups. The conductive particles are distributed in a third array pattern. A first density is defined to represent a number of the conductive particles within a unit area of each of the pre-conductive structures, a second density is defined to represent a number of the conductive particles within a unit area between two of the pre-conductive structures, and the first density is greater than the second density.

To achieve the above, the present disclosure provides a conductive structure array of a target circuit substrate, which comprises a pre-conductive array applied to the target circuit substrate and array-type micro semiconductor structures disposed corresponding to a part or all of the pre-conductive array of the target circuit substrate. Each of the micro semiconductor structures has a pair of electrodes, and each of the electrodes of each of the micro semiconductor structures and the corresponding pre-conductive structure of the target circuit substrate together form a conductive structure. A first density is defined to represent a number of conductive particles within a unit area of each of the conductive structures, a second density is defined to represent a number of the conductive particles within a unit area between two of the conductive structures, and the first density is greater than the second density.

To achieve the above, the present disclosure provides a conductive structure array of a target circuit substrate, which comprises a pre-conductive array applied to the target circuit substrate and array-type micro semiconductor structures disposed corresponding to a part or all of the pre-conductive array of the target circuit substrate. Each of the micro semiconductor structures has an electrode, and the electrode of each of the micro semiconductor structures and the corresponding pre-conductive structure of the target circuit substrate together form a conductive structure. A first density is defined to represent a number of conductive particles within a unit area of each of the conductive structures, a second density is defined to represent a number of the conductive particles within a unit area between two of the conductive structures, and the first density is greater than the second density.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

In the following, the term "target circuit substrate" refers to a non-native substrate for receiving electronic devices. The scales of the electronic devices are not limited, and the electronic devices can widely involve the micro electronic devices or elements having the size smaller than 100 μm. The material of the native substrate or non-native substrate includes polymers, plastics, resins, polyimide, polyethylene naphthalate, polyethylene terephthalate, metal, foil, glass, quartz, flexible glass, semiconductor, sapphire, thin film transistor (TFT), or the likes.

To make this disclosure be easily understood, the "target circuit substrate" described in this disclosure is a thin film transistor (TFT) for example.

First Embodiment

FIGS. 1, 2, 2A, 3, and 3A to 3F show the main concept of the flow chart and manufacturing process of the method for forming a pre-conductive array on a target circuit substrate of this disclosure.

Figure 1:
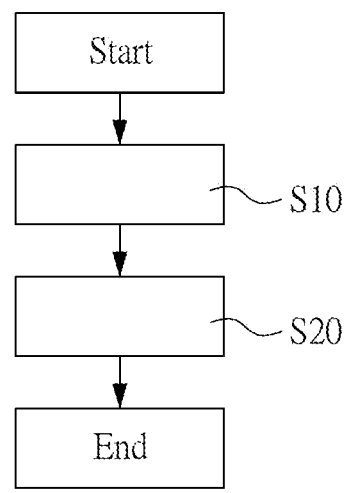
FIG. 1 is a flow chart of disposed a pre-conductive array on a target circuit substrate according to a first embodiment of this disclosure.

As shown in FIG. 1, the method for forming a pre-conductive array on a target circuit substrate of this disclosure at least comprises a step S10 and a step S20.

As shown in FIG. 1, the step S10 is to prepare a target circuit substrate 10. The target circuit substrate 10 comprises a substrate body 12 and a plurality of conductive electrode groups 14 disposed on the substrate body 12. Each of the conductive electrode groups 14 comprises multiple pairs of conductive electrodes 142, and each pair of conductive electrodes 142 comprises two conductive electrodes 144.

The substrate body 12 extends on a first virtual plane, which is defined by the X axis and Y axis. A first distance L1 is defined between every two of the conductive electrode groups 14 along the X axis, a second distance L2 is defined between two adjacent pairs of conductive electrodes 142 along the X axis, and a third distance L3 is defined between every two conductive electrodes 144 of each pair along the X axis. Similarly, the corresponding distances along the Y axis can also be defined on the substrate body 12. For example, a first distance L1' is defined between every two of the conductive electrode groups 14 along the Y axis, a second distance L2' is defined between two adjacent pairs of conductive electrodes 142 along the Y axis, and a third distance L3' is defined between every two conductive electrodes 144 of each pair along the Y axis.

Similarly, at least a first distance can be defined between one conductive electrode group 14 and another conductive electrode group 14 along the X or Y axis. Similarly, at least a second distance can be defined between one pair of conductive electrodes 142 and another pair of conductive electrodes 142 along the X or Y axis. In other words, in either the X axis or the Y axis, a first major distance and at least a first minor distance can be defined between one conductive electrode group 14 and another conductive electrode group 14. Similarly, in either the X axis or the Y axis, a second major distance and at least a second minor distance can be defined between one pair of conductive electrodes 142 and another pair of conductive electrodes 142. Accordingly, the conductive electrode group 14 and another conductive electrode group 14 can be arranged in a first array pattern, and the pair of conductive electrodes 142 and another pair of conductive electrodes 142 can be arranged in a second array pattern.

In addition, the conductive electrode group 14 and another conductive electrode group 14 can be disposed adjacent to each other or symmetrically. Similarly, the pair of conductive electrodes 142 and another pair of conductive electrodes 142 can be disposed adjacent to each other or symmetrically. As shown in FIG. 2A, they are disposed adjacent to each other and symmetrically.

In this embodiment, each pair of conductive electrodes are defined corresponding to the electronic device with horizontal electrodes or flip-chip electrodes. If the electronic device has vertical electrodes, the conductive electrodes are not necessary to be disposed in pairs, and each of the conductive electrode groups is defined to comprise at least a conductive electrode. The details thereof will be described hereinafter with reference to FIG. 2B.

Figure 2:
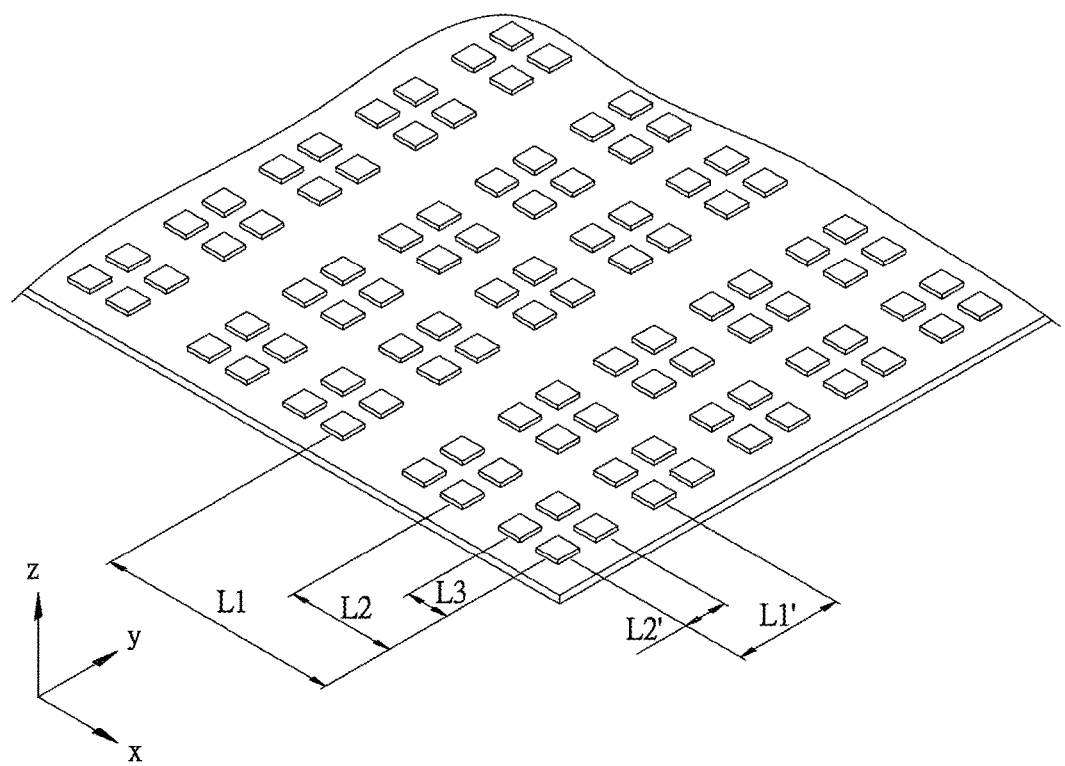
FIGS. 2 and 2A are schematic diagrams showing the structure of the target circuit substrate of FIG. 1.
Figure 2A:
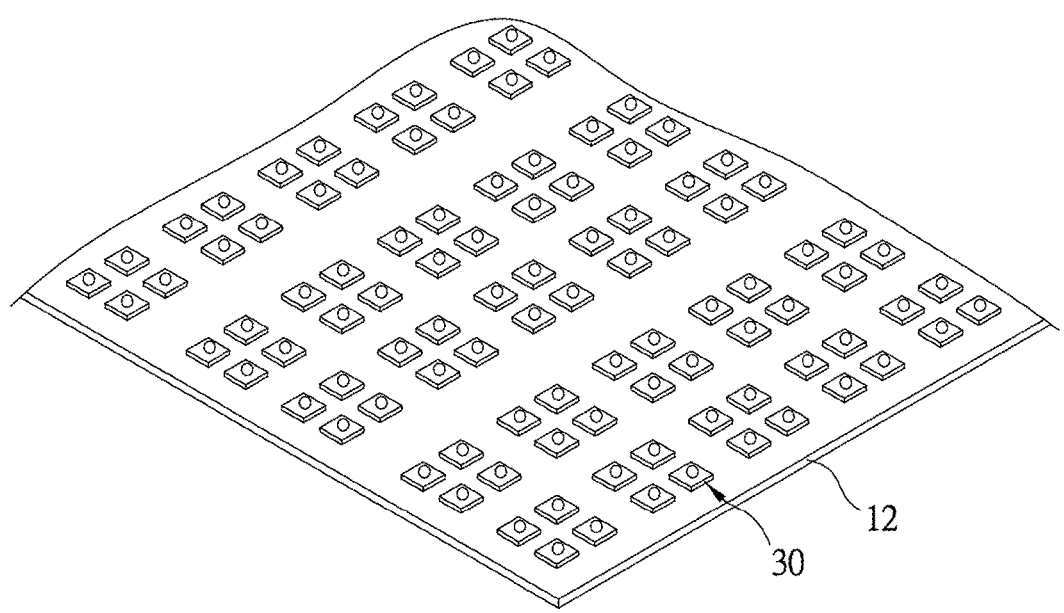
Figure 3:
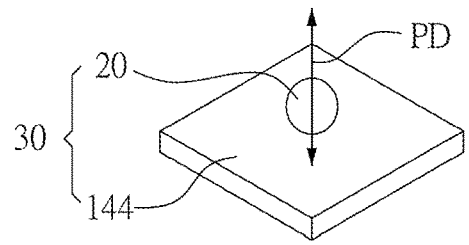
FIGS. 3 and 3A to 3F are schematic diagrams showing different aspects of the pre-conductive structures of FIG. 2A.
Figure 3A:
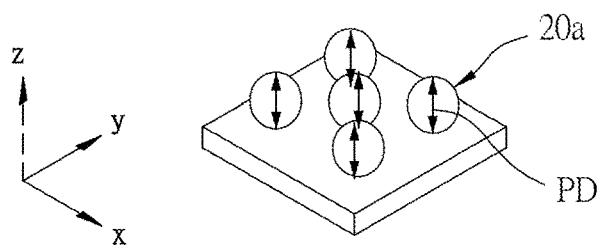

Referring to FIGS. 2A and 3A, the step S20 is to dispose at least a conductive particle 20 on each of the conductive electrodes 144 of a part or all of the conductive electrode groups 14. The conductive particle 20 and the corresponding conductive electrode 144 form a pre-conductive structure 30. The pre-conductive structure 30 forms a pre-conductive path PD towards a Z axis. A first density is defined to represent a number of the conductive particles within a unit area of each pre-conductive structure 30, and a second density is defined to represent a number of the conductive particles within a unit area between two pre-conductive structures 30. The first density is greater than the second density. In this embodiment, the first density is far greater than the second density. The conductive particle 20 is not provided between any two of the pre-conductive structures 30. The pre-conductive structures 30 are arranged based on the rules of the above-mentioned first distances L1 and L1', second distances L2 and L2', and third distance L3, so as to form a pre-conductive array. In general, for example but not limited, the third distance L3 is less than the second distances L2 and L2', and the second distances L2 and L2' are less than the first distances L1 and L1'.

In this embodiment, the third distance L3 is less than 100 μm. This configuration allows the embodiment to be applied to the electronic device with the horizontal electrode or flip-chip electrode, and the scale of the electronic device is smaller than about 100 μm.

According to the current application conditions with reference to the third distance L3 (less than 100 μm) of this embodiment, the particle size of the conductive particles 20 can be, for example, less than 10 μm.

Herein, each conductive particle 20 has an inner core and at least a conductive layer covering the inner core. Moreover, the conductive particle 20 may further have an insulation layer covering the conductive layer.

Regarding the pre-conductive structure:

The conductive particles of the pre-conductive structure will be further described with reference to FIGS. 3A to 3F.

Figure 3B:
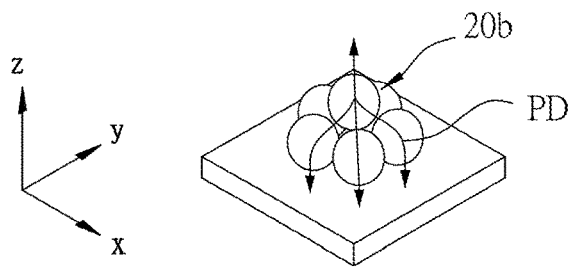
Figure 3C:
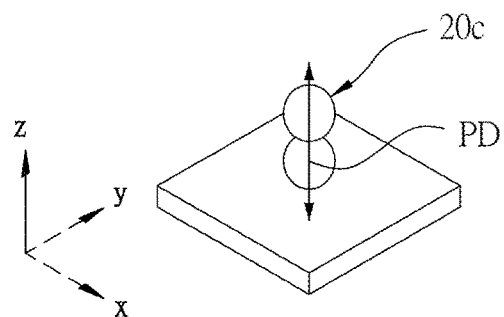

Referring to FIGS. 3A, 3B and 3C, a group of conductive particles 20a (a plurality of conductive particles 20a) are disposed corresponding to the conductive electrode 144. The differences between the conductive particles 20a, 20b and 20c are listed as follow. As shown in FIG. 3A, the conductive particles 20a are distributed on the first virtual plane composed of the X axis and the Y axis. As shown in FIG. 3B, the conductive particles 20b are closely connected and further distributed on the second virtual plane composed of the X axis and the Z axis. As shown in FIG. 3C, the conductive particles 20c are closely connected and distributed on the second virtual plane composed of the X axis and the Z axis.

Figure 3D:
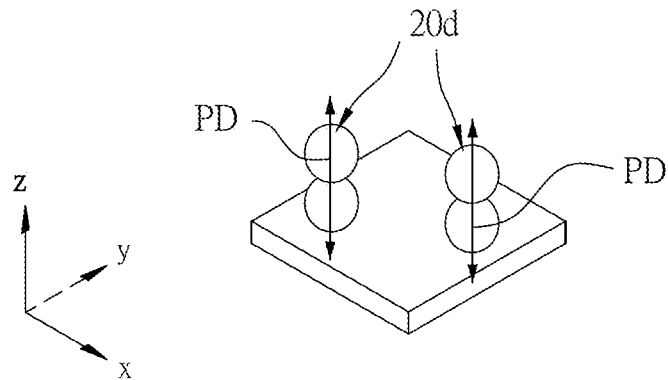
Figure 3E:
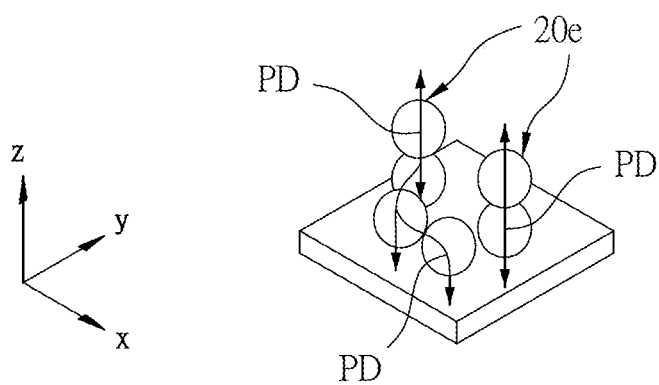
Figure 3F:
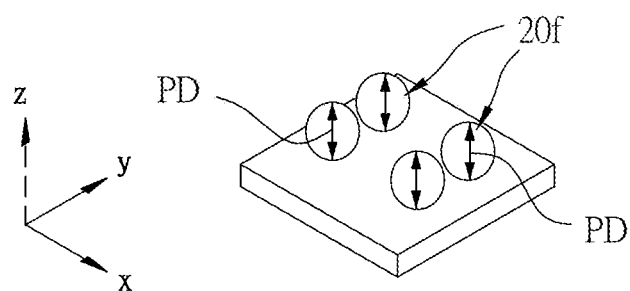

Referring to FIGS. 3D, 3E and 3F, a plurality of groups of conductive particles 20d (a plurality of conductive particles 20a in each group) are disposed corresponding to the conductive electrode 144. The differences between the conductive particles 20d, 20e and 20f are listed as follow. As shown in FIG. 3D, the conductive particles 20d of each group are distributed on the second virtual plane composed of the X axis and the Z axis. As shown in FIG. 3E, the conductive particles 20e of each group are distributed on the second virtual plane composed of the X axis and the Z axis, and further contacted on the first virtual plane composed of the X axis and the Y axis. As shown in FIG. 3F, the conductive particles 20f of each group are mainly distributed on the first virtual plane composed of the X axis and the Y axis.

No matter the distributed conductive particles are arranged in order or disorder, they are disposed corresponding to the conductive electrode and providing at least one pre-conductive path PD along the Z axis for the conductive electrode. In addition, since the conductive particles are disposed on the corresponding conductive electrode, the first density is greater than the second density. In this embodiment, the first density is far greater than the second density. In other words, no conductive particle is provided between any two of the pre-conductive structures.

Regarding the conductive electrode:

The cooperation with the conductive electrodes of vertical-electrode electronic device will be described with reference to FIG. 2B.

The target circuit substrate 10a comprises a substrate body 12a and a plurality of conductive electrode groups 14a disposed on the substrate body 12a. The conductive electrodes 144a are not configured in pairs. Thus, in this embodiment, each of the conductive electrode groups 14a comprises a conductive electrode 144a, and at least a conductive particle 20 is provided on each of the conductive electrodes 144a.

The substrate body 12a extends on a first virtual plane, which is defined by the X axis and Y axis. A first distance L11 is defined between every two of the conductive electrode groups 14a along the X axis, a second major distance L21 is defined between two adjacent conductive electrodes 144a along the X axis, or a second minor distance L22 is defined between two adjacent conductive electrodes 144a along the X axis. The second major distance L21 can be the same as or different from the second minor distance L22.

Similarly, at least a second sub-minor distance is defined along the X axis.

Similarly, a first distance L11', which is corresponding to but not limited to be equal to the first distance L11 along the X axis, is defined along the Y axis, a second major distance L21', which is corresponding to but not limited to be equal to the second major distance L21 along the X axis, is defined along the Y axis, or a second minor distance L22', which is corresponding to but not limited to be equal to the second minor distance L22 along the X axis, is defined along the Y axis. In other words, a plurality of minor distances can also be defined along the Y axis.

Therefore, as shown in FIGS. 2 and 2A, at least a minor distance can be defined along the X axis or the Y axis between the conductive electrode groups 14 and the conductive electrodes 144 thereof.

Second Embodiment

The second embodiment will be described with reference to FIGS. 6A to 6E, 7A, 7B, 7C and 8A in view of FIG. 1. The steps and components having similar instructions and functions have the same reference numbers of the first embodiment.

Figure 6A:
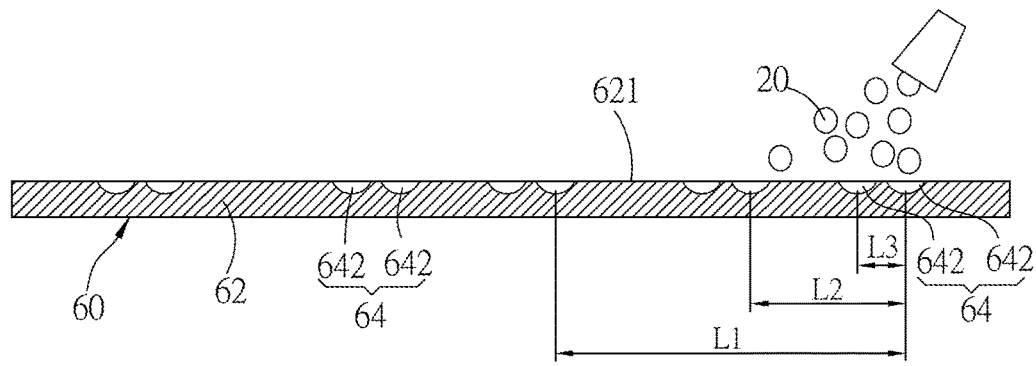
FIGS. 6A to 6E, 7A, 7B, 7C and 8A are schematic diagrams showing the manufacturing process for disposing the pre-conductive array on the target circuit substrate according to a second embodiment of this disclosure.

Before, after or in the step S10, as shown in FIG. 6A, the embodiment further comprises a step for providing a steel plate 60 and providing a plurality of conductive particles 20. The steel plate 60 has a plate body 62, and a plurality of accommodating units 64 are provided on the plate body 62. Each accommodating unit 64 comprises a plurality of accommodating spaces 642. In this embodiment, each accommodating space 642 is a recess.

Figure 6B:
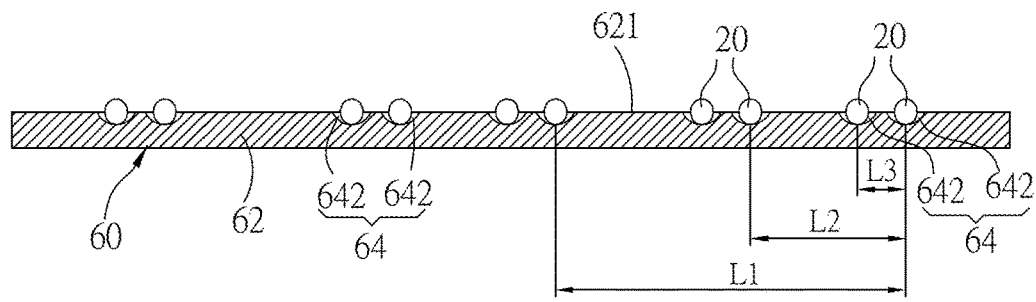

As shown in FIG. 6B, the steel plate 60 carries a plurality of conductive particles 20. In all or a part of the accommodating units 64, all or a part of the accommodating spaces 642 can carry at least one of the conductive particles 20. The steel plate 60 has an outer surface 621, and the carried conductive particle 20 is exposed from the outer surface 621 of the steel plate 60.

Figure 6C:
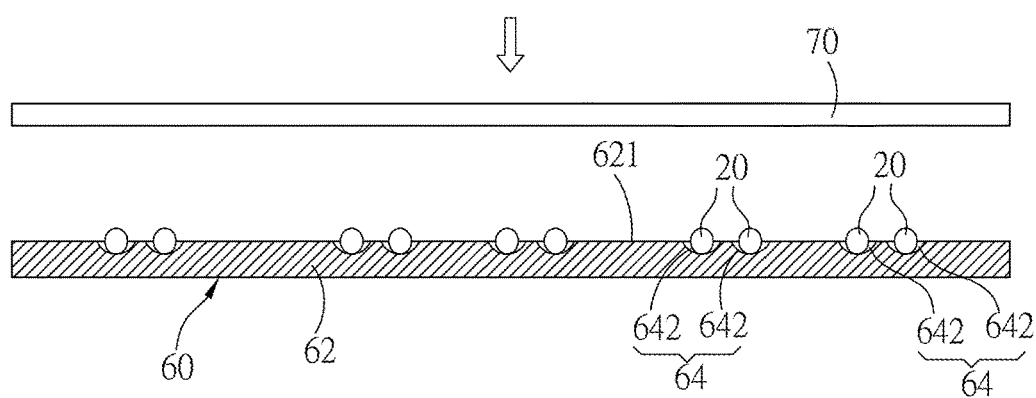

As shown in FIG. 6C, a carrying device 70 is provided to pick up the conductive particles 20 carried by the steel plate 60. In this embodiment, the carrying device 70 is made of polymer organic silicon compound material, such as polydimethylsiloxane (PDMS), which has adhesiveness for attaching and picking up the conductive particles 20 exposed from the steel plate 60.

Figure 6D:
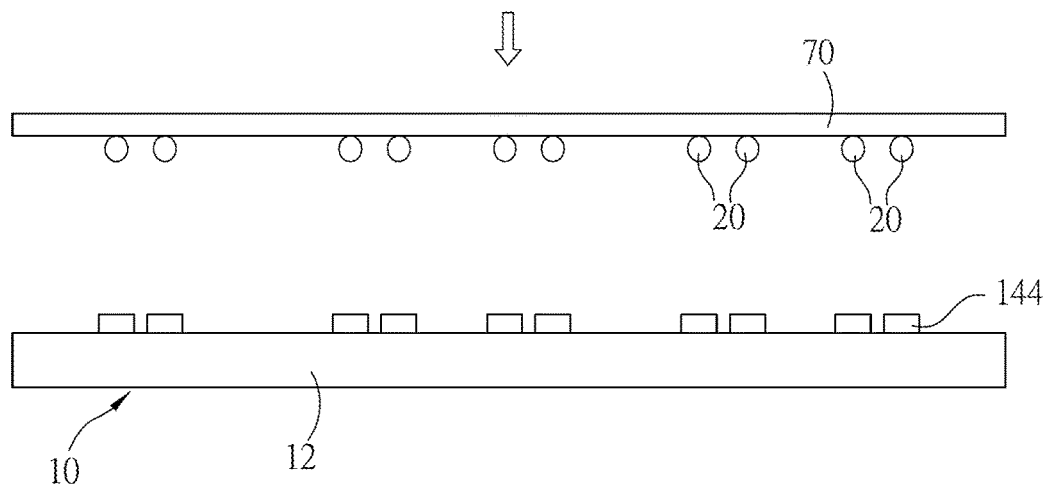
Figure 6E:
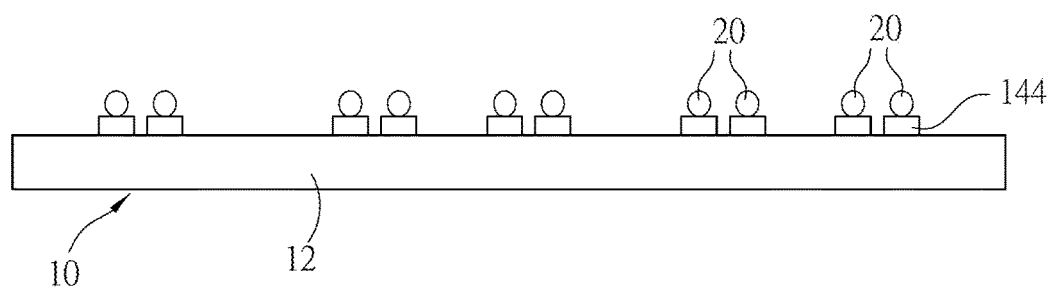

As shown in FIG. 6D, the carrying device 70 transfers the conductive particles 20. As shown in FIG. 6E, after the conductive particles 20 are moved to the target circuit substrate 10, the carrying device 70 is removed. In this embodiment, the carrying device 70 can replaced by any structure having the same function, such as the electrostatic suction, negative (gas) pressure suction, clamping and carrying, attaching roller with adhesion and carrying functions, or the combination of the attaching plate and the attaching roller. To be noted, each of the suction, adhesion and attaching is an aspect of carrying. The above examples are for illustrations only, and are not to limit the scope of this disclosure. Any technology and device that can finally carry the conductive particles 20 can be used in this disclosure.

Similarly, the steel plate 60 can also be replaced by any structure having the same function for arranging the conductive particles regularly in an array.

Regarding the pre-adhesive:

The details of the embodiment shown in FIGS. 6D and 6E will be further described with reference to FIGS. 7A, 7B, 7C and 8A.

Figure 7A:
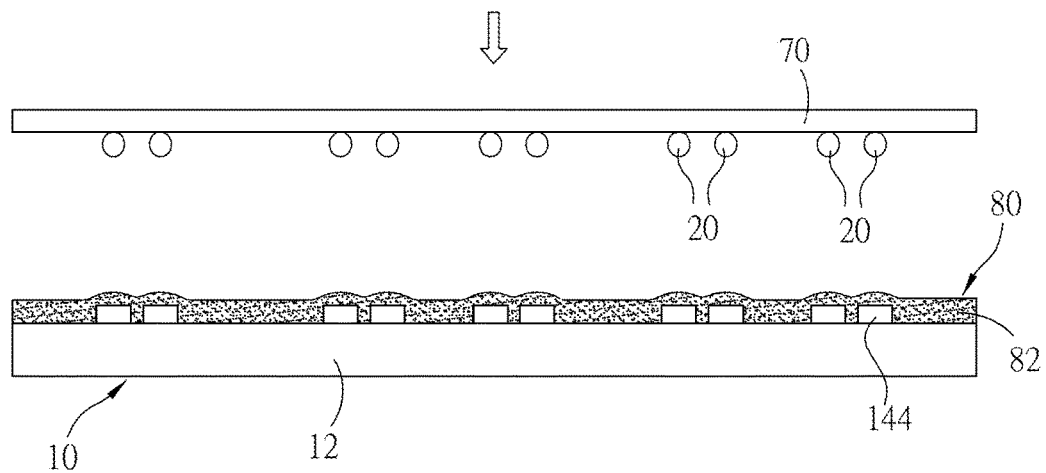

As shown in FIG. 7A, the pre-adhesive is to apply at least a contact layer 80 on the target circuit substrate 10. In this embodiment, a frit contact layer 82 is applied on the target circuit substrate 10, and the carrying device 70 is moved approaching the first contact layer 82 of the target circuit substrate 10.

Figure 7B:
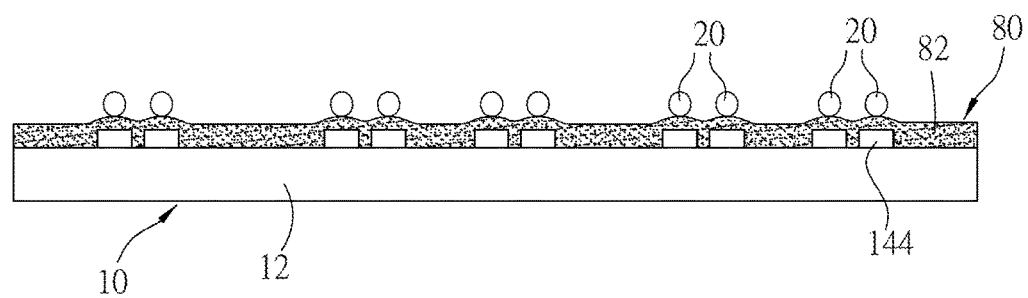

As shown in FIG. 7B, the carrying device 70 transfers the conductive particles 20 on to the first contact layer 82 of the target circuit substrate 10, and then the carrying device 70 is removed. In this embodiment, the first contact layer 82 can provide the positioning function for the conductive particles 20.

Figure 7C:
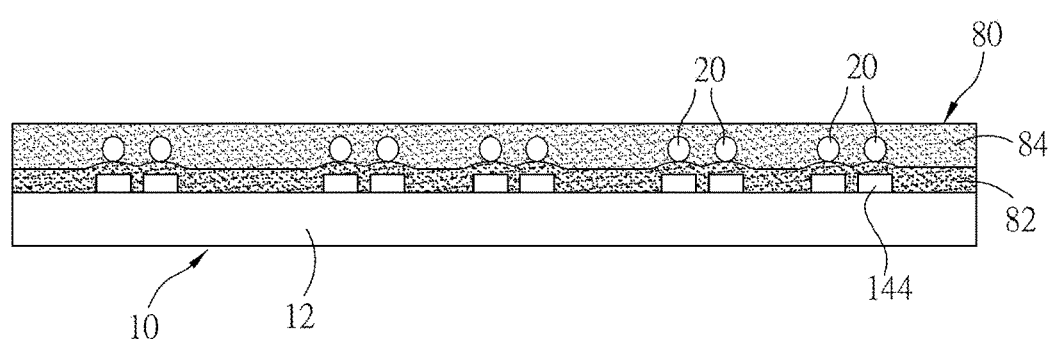

As shown in FIG. 7C, after positioning the conductive particles 20 on the first contact layer 82 of the target circuit substrate 10, a second contact layer 84 is applied on the first contact layer 82. In this embodiment, the second contact layer 84 can provide the positioning function for the following provided electronic devices.

Figure 8A:
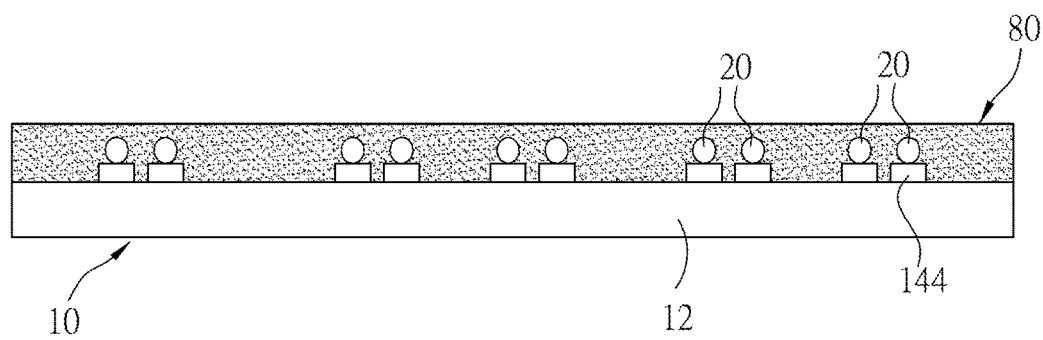

In the embodiment, the conductive particles 20 are disposed inside the contact layer 80. For example, the conductive particles 20 can be disposed within the first contact layer 82, above the first contact layer 82, or above the first contact layer 82 and within the second contact layer 84. As shown in FIG. 8A, the conductive particles 20 is disposed within the first contact layer 82 of the contact layer 80.

To be noted, in this disclosure, the step for applying at least one contact layer 80 (comprising the first contact layer 82 and the second contact layer 84) and the step S20 for disposing the conductive particles can be alternately performed. Accordingly, the distribution of the conductive particles 20c, 20d, and 20e as shown in FIGS. 3C, 3D and 3E can be achieved. In addition, in order to achieve the distribution of the conductive particles 20c, 20d, and 20e as shown in FIGS. 3C, 3D and 3E, it is also possible to provide a limiting structure (not shown) on the conductive electrodes 144 of the target circuit substrate 10 along the Z axis for limiting and positioning the conductive particles on the conductive electrodes 144. The above descriptions are for illustrations only and are not to limit the scope of this disclosure.

Third Embodiment

The third embodiment will be described with reference to FIGS. 9A to 9C in view of FIG. 1. The steps and components having similar instructions and functions have the same reference numbers of the second embodiment.

Figure 9A:
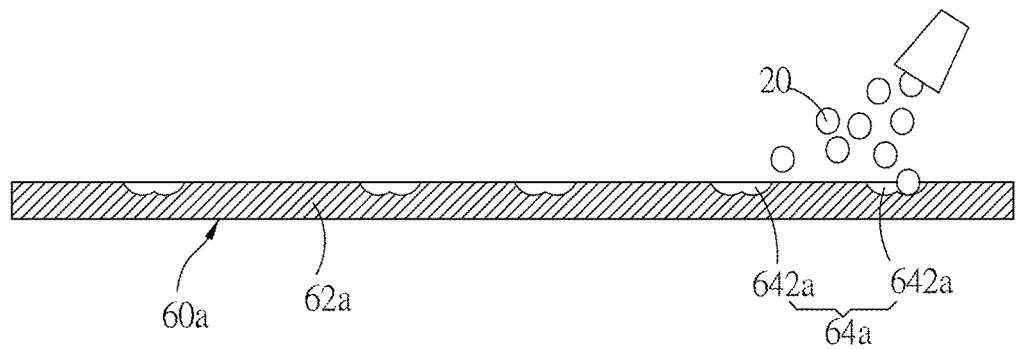
FIGS. 9A to 9C are schematic diagrams showing the manufacturing process for disposing the pre-conductive array on the target circuit substrate according to a third embodiment of this disclosure.

Before, after or in the step S10, as shown in FIG. 9A, the embodiment further comprises a step for providing a steel plate 60a and providing a plurality of conductive particles 20. The steel plate 60a has a plate body 62a, and a plurality of accommodating units 64a are provided on the plate body 62a. Each accommodating unit 64a comprises a plurality of accommodating spaces 642a. In this embodiment, each accommodating space 642a comprises a plurality of recesses 642a.

Figure 9B:
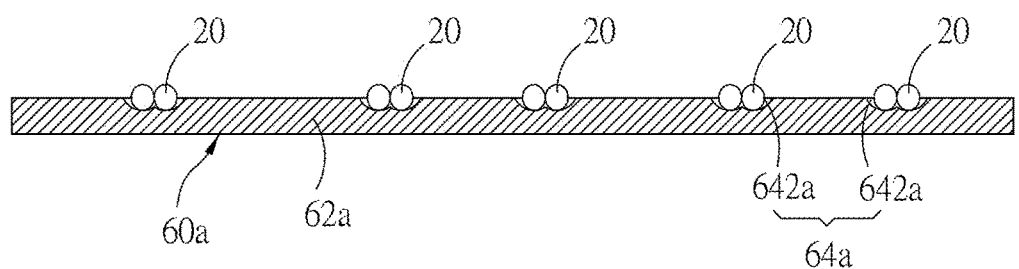

As shown in FIG. 9B, the steel plate 60a carries a plurality of conductive particles 20. In all or a part of the accommodating units 64a, all or a part of the accommodating spaces 642a can carry a plurality of the conductive particles 20.

Figure 9C:
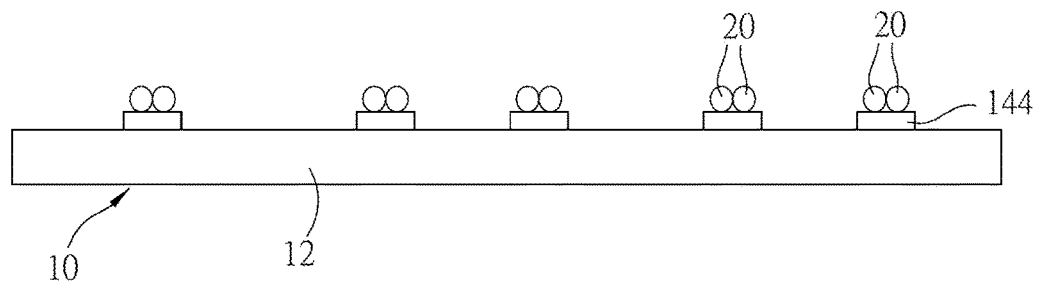

As shown in FIG. 9C, the conductive particles 20 are transferred to the target circuit substrate 10. Multiple conductive particles 20 carried by one recess 642a are positioned on the same one conductive electrode 144. This step can form the pre-conductive structures as shown in FIGS. 3A to 3F.

Fourth Embodiment

The fourth embodiment will be described with reference to FIG. 10A in view of FIG. 1. The steps and components having similar instructions and functions have the same reference numbers of the second embodiment.

Figure 10A:
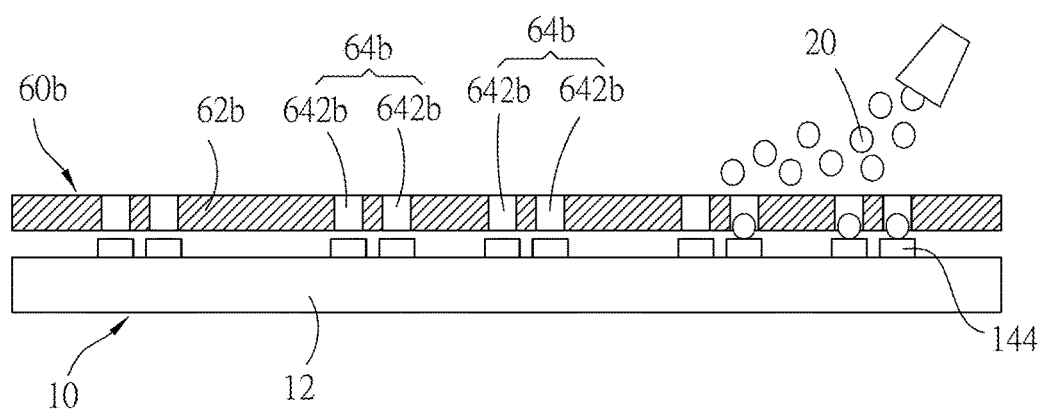
FIG. 10A is a schematic diagram showing the manufacturing process for disposing the pre-conductive array on the target circuit substrate according to a fourth embodiment of this disclosure.

Before, after or in the step S10, as shown in FIG. 10A, the embodiment further comprises a step for providing a steel plate 60b. The steel plate 60b has a plate body 62b, and a plurality of accommodating units 64b are provided on the plate body 62b. Each accommodating unit 64b comprises at least a through hole 642b. The target circuit substrate 10 is moved approaching the steel plate 62b, and the through holes 642b of the steel plate 62b are disposed corresponding to all or a part of the conductive electrodes 144 of the conductive electrode groups 14. Then, a plurality of conductive particles 20 are provided, and at least one of the conductive particles 20 can pass through each of the through holes 642b and be positioned on each of the corresponding conductive electrodes 144 of the conductive electrode groups 14.

Of course, in this embodiment, at least a contact layer 80 can be applied on the circuit substrate 10 for further positioning each of the conductive particles 20.

Fifth Embodiment

The fifth embodiment will be described with reference to FIGS. 11A to 11C in view of FIG. 1. The steps and components having similar instructions and functions have the same reference numbers of the second embodiment.

Figure 11A:
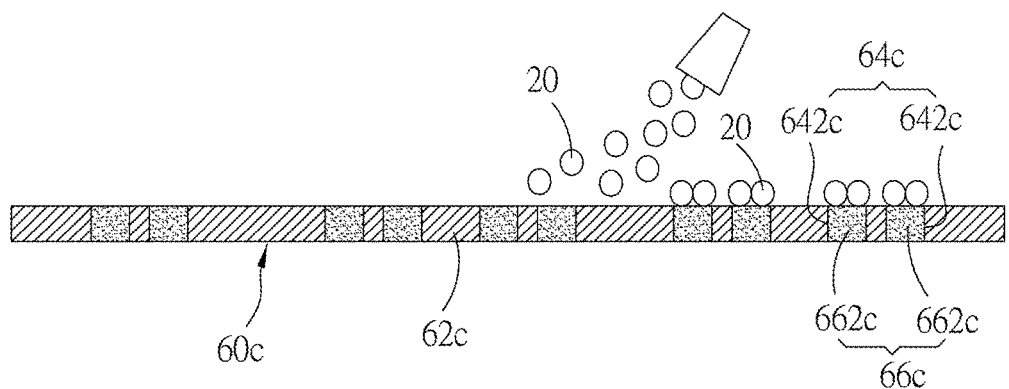
FIGS. 11A to 11C are schematic diagrams showing the manufacturing process for disposing the pre-conductive array on the target circuit substrate according to a fifth embodiment of this disclosure.

Before, after or in the step S10, as shown in FIG. 11A, the embodiment further comprises a step for providing a steel plate 60c. The steel plate 60c has a plate body 62c. A plurality of accommodating units 64c are provided on the plate body 62c, and a plurality of adhesive units 66c are provided in all or a part of the accommodating units 64c. Each accommodating unit comprises at least an accommodating space, which can be a recess or a through hole. In this embodiment, each accommodating unit 64c comprises two through holes 642c, and each adhesive unit 66c comprises two adhesive members 662c, which are disposed corresponding to the two through holes 642c of each accommodating unit 64c.

A plurality of conductive particles 20 are provided, so that at least one conductive particle 20 is attached to each of the adhesive members 662c. In each accommodating unit 64c, all or a part of the through holes 642c can carry multiple of conductive particles 20. In other words, the adhesive members 662c of the adhesive units 66c are disposed inside all or a part of the through holes 642c of the accommodating units 64c, respectively, and this configuration can determine the amount of the conductive particles 20 carried by the steel plate 60c.

Figure 11B:
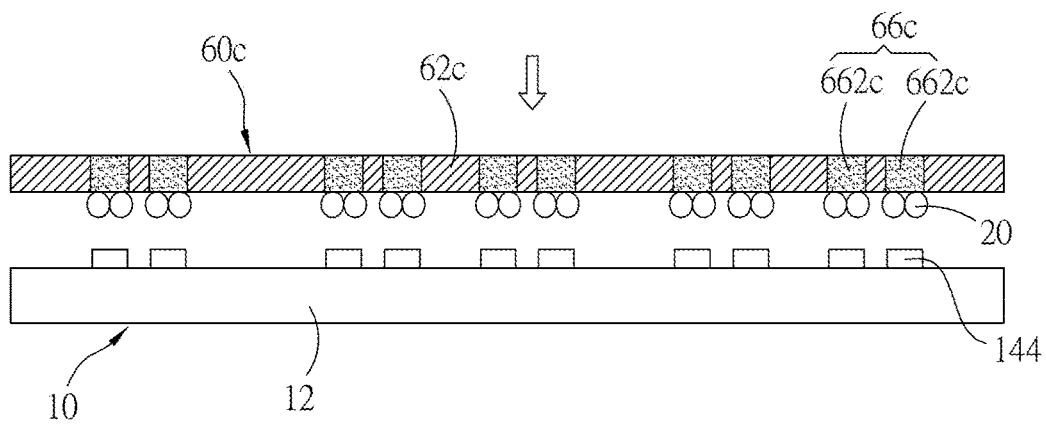

As shown in FIG. 11B, the steel plate 60c carrying the conductive particles 20 is reversed and moved approaching the target circuit substrate 10, so that the conductive particles 20 adhered to the adhesive members 662c can be positioned on the corresponding conductive electrodes 144 of the conductive electrode groups 14, respectively.

Figure 11C:
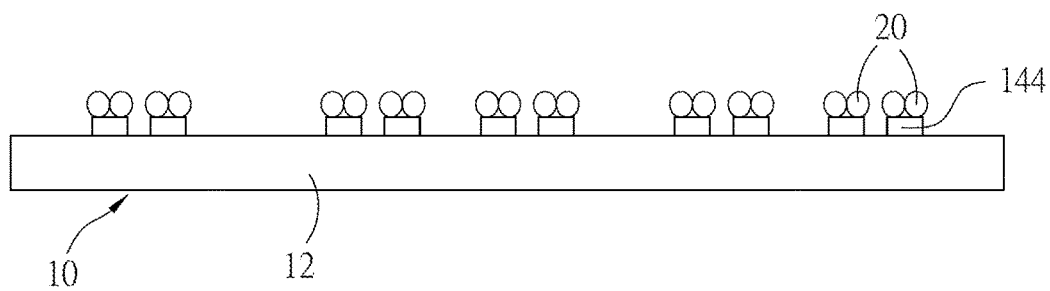

As shown in FIG. 11C, the steel plate 60c is removed so as to form the pre-conductive structures as shown in FIGS. 3A to 3F.

Sixth Embodiment

The sixth embodiment will be described with reference to FIGS. 12A to 12B in view of FIG. 1. The steps and components having similar instructions and functions have the same reference numbers of the fifth embodiment.

Figure 12A:
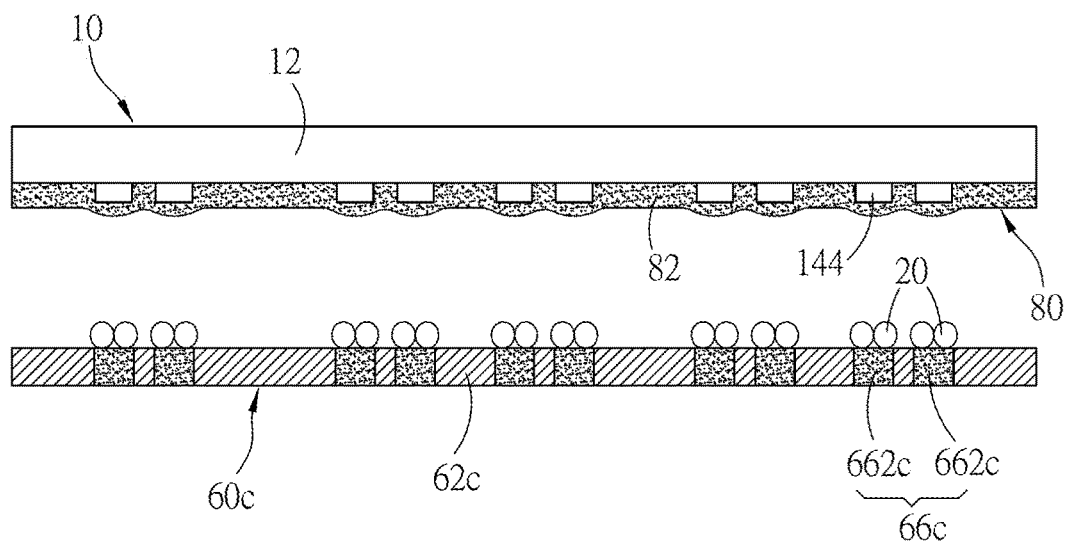
FIGS. 12A and 12B are schematic diagrams showing the manufacturing process for disposing the pre-conductive array on the target circuit substrate according to a sixth embodiment of this disclosure.

Before, after or in the step S10, as shown in FIG. 12A, the embodiment further comprises a step for applying at least a contact layer 80 on the target circuit substrate 10, and reversing the target circuit substrate 10. Then, the steel plate 60c carrying a plurality of conductive particles 20 as shown in the fifth embodiment is provided and disposed approaching the target circuit substrate 10.

Figure 12B:
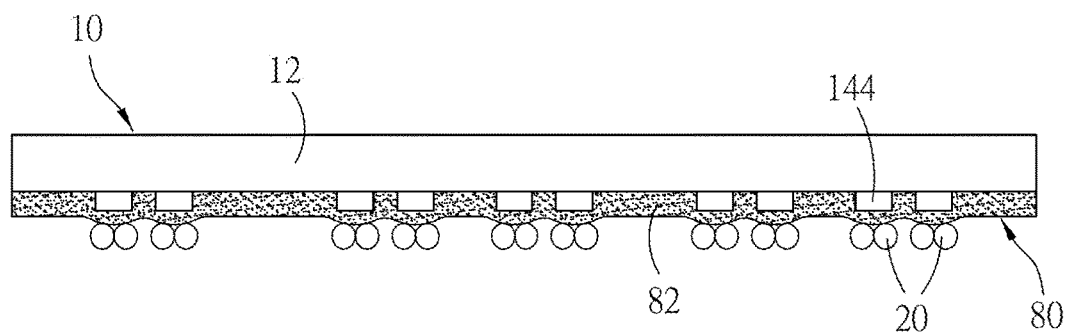

As shown in FIG. 12B, the conductive particles 20 adhered by each of the adhesive member 662c can contact with the above-mentioned contact layer 80 and be positioned on the corresponding conductive electrodes 144 of the conductive electrode groups 14, respectively. Then, the steel plate 60c is removed so as to form the pre-conductive structures as shown in FIGS. 3A to 3F.

In this embodiment, similar to the above-mentioned second embodiment, the first contact layer 82 is applied on the target circuit substrate 10, the conductive particles 20 contact with the first contact layer 82, and then another contact layer is applied thereon.

To be noted, the target circuit substrate 10 is reversed for performing the following processes, and this configuration can also be applied to other embodiments.

To be noted, the contact layer 80 is configured for more properly positioning the conductive particles 20 on the conductive electrodes 144. In another case that does not form the contact layer 80, it is possible to pre-melt the conductive electrodes 144 to provide a slight adhesion. This configuration can also achieve the desired transferring result, and this can also be applied to other embodiments.

Seventh Embodiment

The seventh embodiment will be described with reference to FIGS. 13, 14A and 14B in view of FIG. 1. The steps and components having similar instructions and functions have the same reference numbers of the second embodiment.

In or before the step S20, the seventh embodiment further comprises the following steps.

Figure 13:
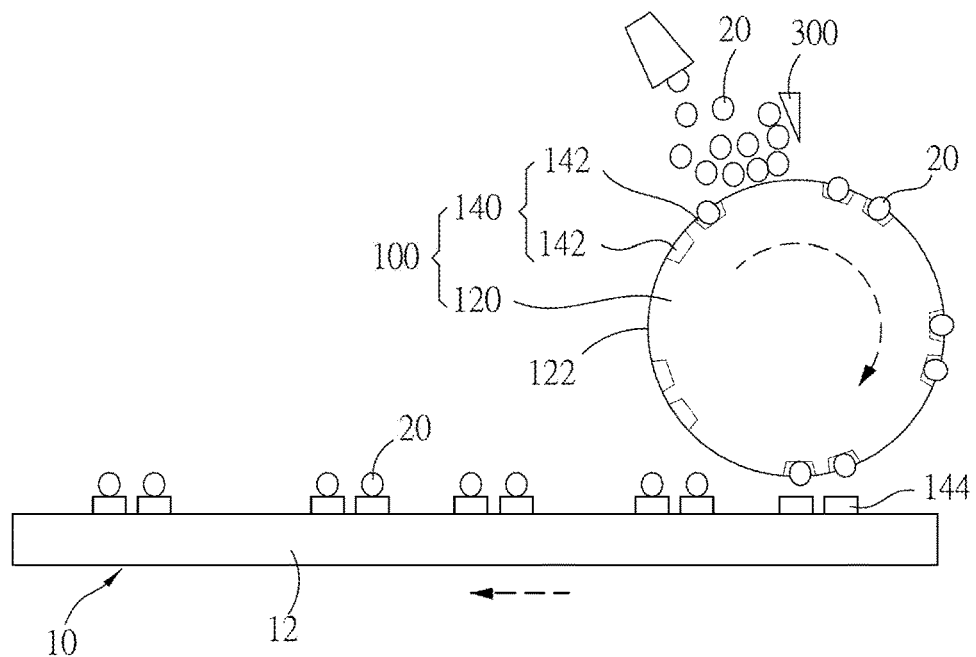
FIGS. 13, 14A and 14B are schematic diagrams showing the manufacturing process for disposing the pre-conductive array on the target circuit substrate according to a seventh embodiment of this disclosure.

As shown in FIG. 13, a printing roller 100, which carries a plurality of conductive electrodes 20, is provided. The printing roller 100 has a roller body 120 and a plurality of accommodating units 140 disposed on the roller body 120. Each accommodating unit 140 has a plurality of accommodating spaces 142. In all or a part of the accommodating units 140, all or a part of the accommodating spaces 142 carry at least one of the conductive particles 20.

In this embodiment, when providing the conductive particles 20, a stopping element 300 is provided to sweep the redundant conductive particles 20, so that the conductive particles 20 disposed in the accommodating spaces 142 can be moved and transferred as the rotation of the printing roller 100.

Similarly, the design of the stopping element 300 can be widely applied to other embodiments.

In this embodiment, the printing roller 100 has an outer surface 122, and the conductive particle 20 carried in each accommodating space 142 is exposed from the outer surface 122 of the printing roller 100.

Figure 14A:
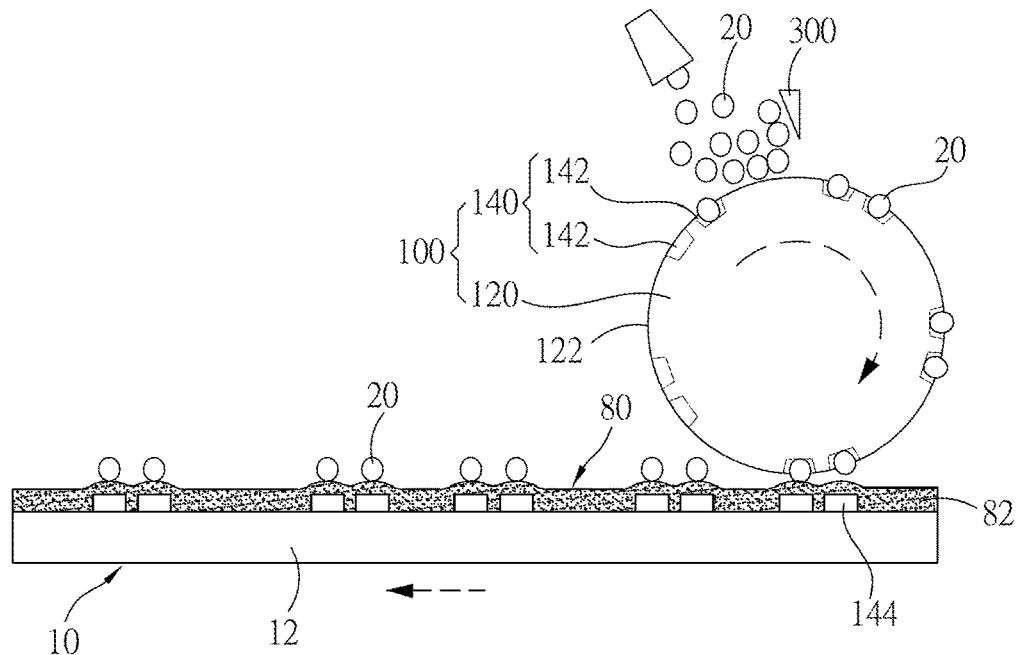
Figure 14B:
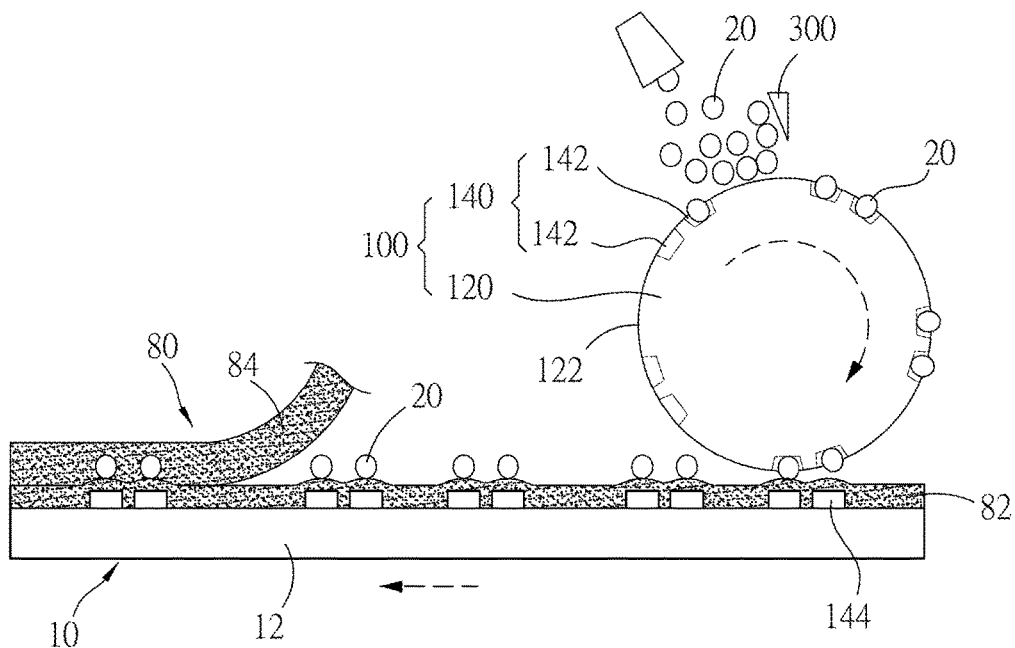

Regarding the pre-adhesive:

Please refer to FIGS. 14A and 14B, which are similar to FIGS. 7B and 7C.

As shown in FIG. 14A, a first contact layer 82 is applied on the target circuit substrate 10, so that when the printing roller 100 moves approaching the first contact layer 82 of the target circuit substrate 10, the carried conductive particles 20 can be positioned on the corresponding conductive electrodes 144 of the target circuit substrate 10.

As shown in FIG. 14B, the target circuit substrate 10 is moved with respective to the printing roller 100. After positioning the conductive particles 20 on the first contact layer 82 of the target circuit substrate 10, a second contact layer 84 is applied on the first contact layer 82. The applying rate of the second contact layer 84 can match the rotation speed of the printing roller 100.

Eighth Embodiment

The eighth embodiment will be described with reference to FIG. 15 in view of FIG. 1. The steps and components having similar instructions and functions have the same reference numbers of the fifth embodiment.

In or before the step S20, the eighth embodiment further comprises the following steps.

Figure 15:
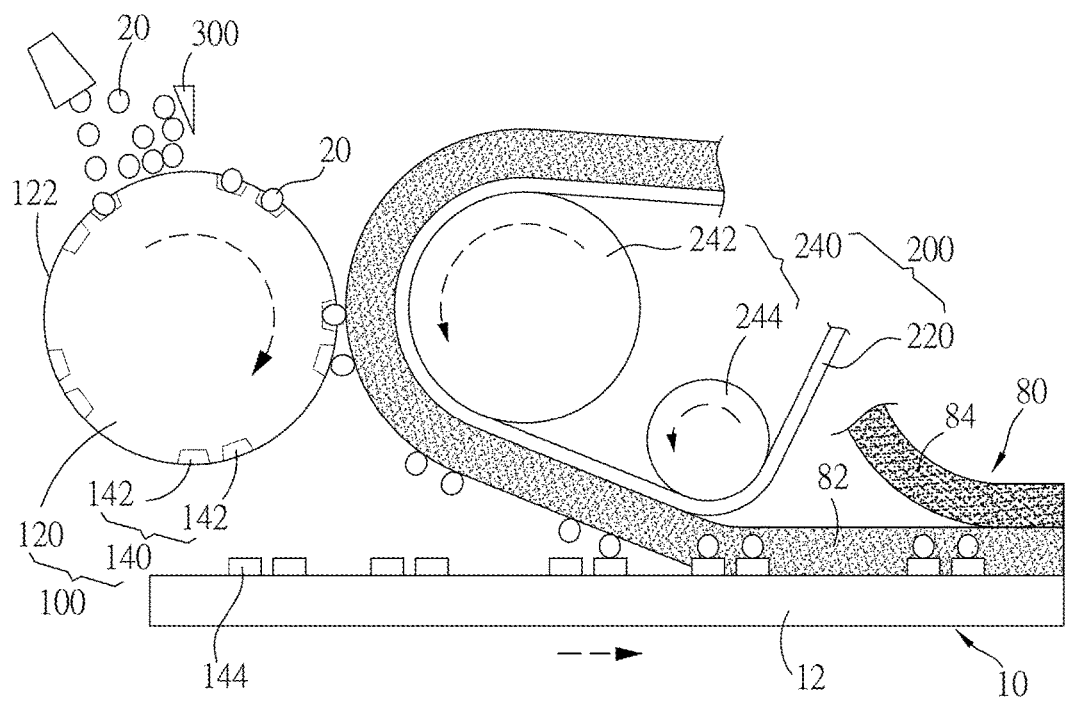
FIG. 15 is a schematic diagram showing the manufacturing process for disposing the pre-conductive array on the target circuit substrate according to an eighth embodiment of this disclosure.

As shown in FIG. 15, a first contact layer 82 is applied on a roller transmission mechanism 200, so that the first contact layer 82 can be moved along with the roller transmission mechanism 200. In this embodiment, the roller transmission mechanism 200 comprises a plurality of rollers 240 and a transmission belt 220. The rollers 240 at least comprise a driving roller 242 and a passive roller 244. The transmission belt 220 can drive the driving roller 242 and the passive roller 244 to rotate together.

When the printing roller 100 moves approaching the first contact layer 82 of the roller transmission mechanism 200, the conductive particles 20 can be transferred to the first contact layer 82. The first contact layer 82 is moved along with the roller transmission mechanism 200 and applied on the target circuit substrate 10. Accordingly, the conductive particles 20 carried by the first contact layer 82 can be positioned on the corresponding conductive electrodes 144 of the conductive electrode groups 14.

The target circuit substrate 10 is moved with respective to the roller transmission mechanism 200. After applying the first contact layer 82 on the target circuit substrate 10, a second contact layer 84 is applied on the first contact layer 82. The applying rate of the second contact layer 84 can match the rotation speed of the transmission belt 220.

Ninth Embodiment

Figure 4:
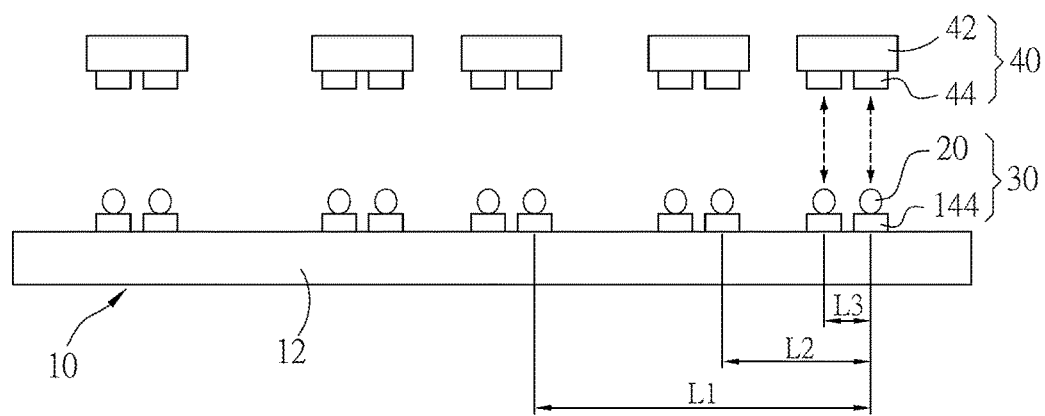
FIG. 4 is a schematic diagram showing an embodiment of the manufacturing process for forming conductive structure array on a target circuit substrate

As shown in FIG. 4, the embodiment is the manufacturing process for forming conductive structure array on a target circuit substrate, which is suitable for the products of the first to eighth embodiments. The different aspects of the structures can be referred to FIGS. 5A to 5C. The steps and components having similar instructions and functions have the same reference numbers of the first embodiment.

After the step S20, the ninth embodiment further comprises the following steps.

As shown in FIG. 4, a plurality of electronic devices are disposed on the target circuit substrate 10. Each electronic device has at least an electrode, and the electrodes of the electronic devices are positioned corresponding to all or a part of the pre-conductive structures 30.

In this embodiment, the electronic device is a micro semiconductor structure 40, and the micro semiconductor structures 40 are usually arranged in an array. The micro semiconductor structure 40 comprises a main body 42 and at least an electrode 44. In the following, the terms "semiconductor structure" and "semiconductor device" are synonyms generally referring to a semiconductor material, die, structure, device, component of a device, or semi-finished product. The term "micro" of micro semiconductor structures and micro semiconductor devices generally refers to microscales. Semiconductor devices include high-quality monocrystalline semiconductors and polycrystalline semiconductors, semiconductor materials fabricated by high temperature processing, doped semiconductor materials, organic and inorganic semiconductors, and combinations of semiconductor materials and structures having one or more additional semiconductor components or non-semiconductor components (such as dielectric layers or materials, or conductive layers or materials). Semiconductor devices include, but are not limited to, transistors, photovoltaic devices including solar cells, diodes, light-emitting diodes, laser diodes, p-n junction diodes, photodiodes, integrated circuits, and sensors. In addition, a semiconductor device may refer to a component or portion of a functional semiconductor device or product. In this embodiment, the micro semiconductor structures 40 can be individual micro LED final products (micro LED dies), or individual micro LED semi-finished products.

Figure 5A:
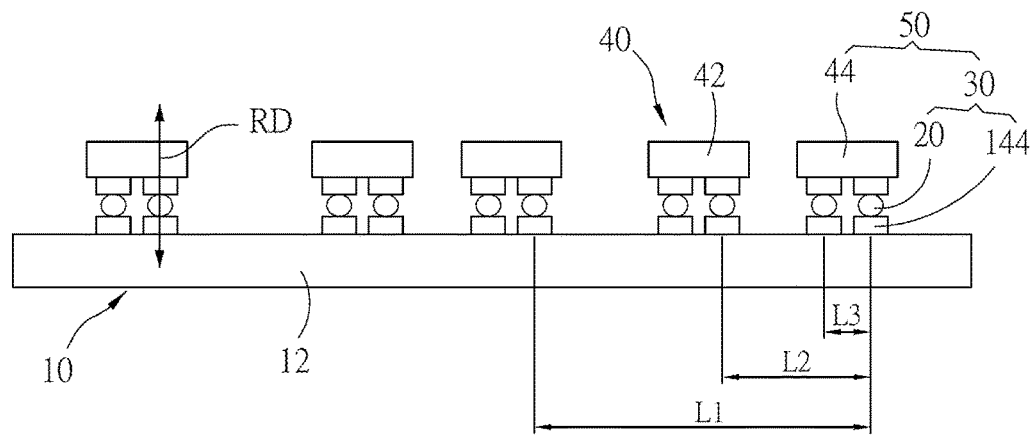
FIG. 5A is a schematic diagram showing the conductive structures disposed on the target circuit substrate according to a first embodiment of this disclosure, which is corresponding to FIGS. 2 and 2A.

As shown in FIG. 5A in view of FIG. 2A, after the structure of FIG. 4, each micro semiconductor structure 40 is a horizontal-electrode or flip-chip micro LED die. The micro semiconductor structures 40 and the target circuit substrate 10 are combined by thermal pressing, so that the pair of electrodes 44 of each micro semiconductor structure 40 and the corresponding pre-conductive structure 30 of the target circuit substrate 10 can together form a conductive structure 50. Accordingly, the conductive structure array can be formed on the target circuit substrate. There is no conductive particle 20 configured between any two of the conductive structures 50. In the conductive structure 50, the conductive particles 20 are thermal pressed and transformed to an elliptic shape, thereby stably creating a real conductive path RD between the electrode 44 of the micro semiconductor structure 40 and the conductive electrode 144 of the target circuit substrate 10. Of course, the amount of the real conductive paths RD is not limited to those shown in the figure, and is determined by the factors of the material matching degree between the conductive particles 20 and the electrodes 44 and 144, and the conditions of the thermal pressing.

Figure 2B:
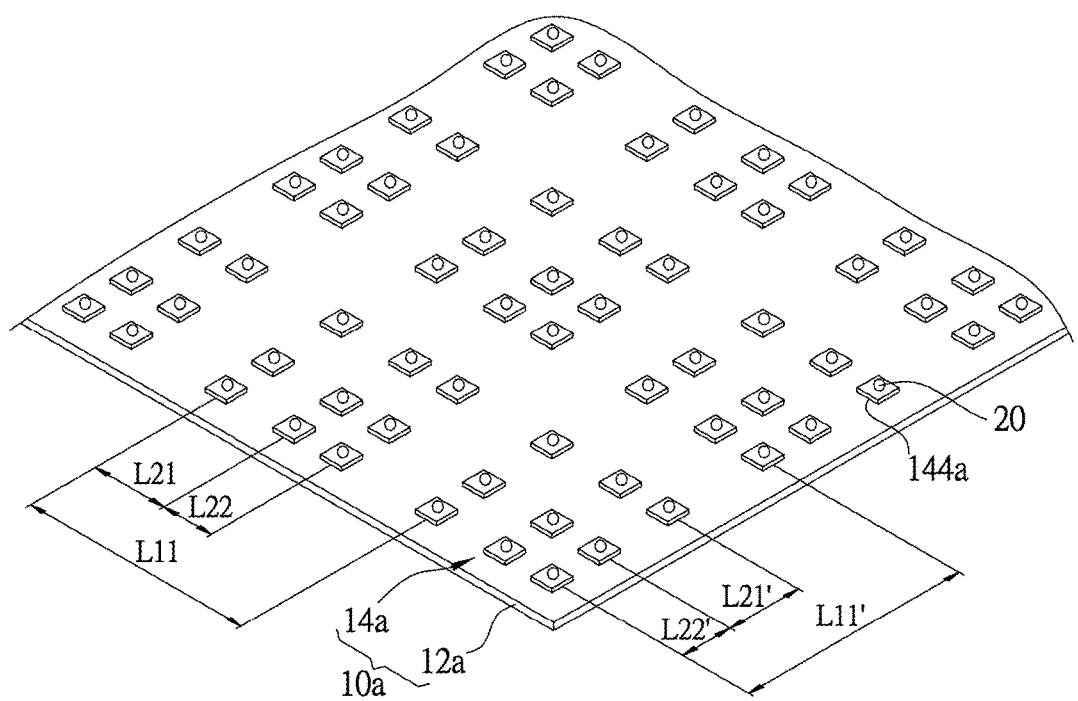
FIG. 2B is a schematic diagram showing another pre-conductive structure and target circuit substrate other than those shown in FIG. 1.
Figure 5B:
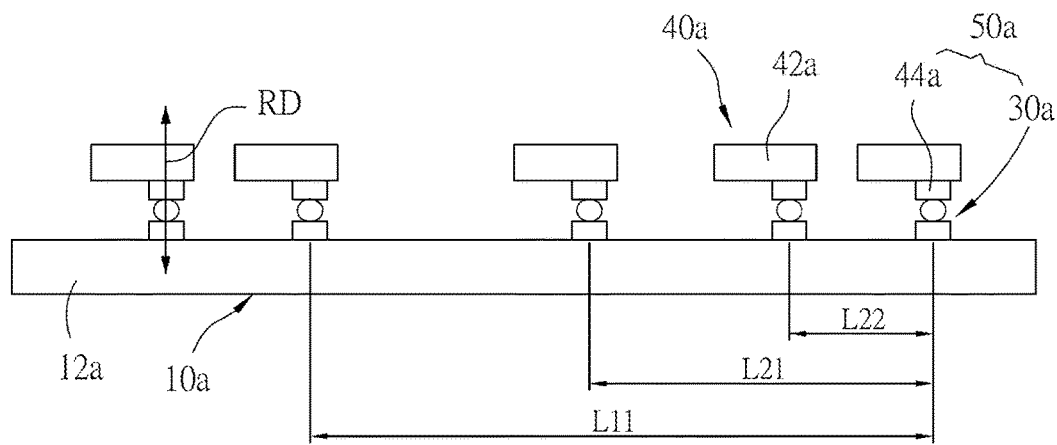
FIG. 5B is a schematic diagram showing another aspect of the conductive structures disposed on the target circuit substrate according to the first embodiment of this disclosure, which is corresponding to FIG. 2B.

As shown in FIG. 5B in view of FIG. 2B, another structure aspect of the ninth embodiment is disclosed. In this case, each micro semiconductor structure 40a is a vertical-electrode micro LED die. The micro semiconductor structures 40a and the target circuit substrate 10a are combined by thermal pressing, so that an electrode 44a of each micro semiconductor structure 40a and the corresponding pre-conductive structure 30a of the target circuit substrate 10a can together form a conductive structure 50a as well as a real conductive path RD thereof. A first density is defined to represent a number of the conductive particles within a unit area of each conductive structure 50a, and a second density is defined to represent a number of the conductive particles within a unit area between two conductive structures 50a. The first density is greater than the second density. In this embodiment, the first density is far greater than the second density. The conductive particle 20 is not provided between any two of the conductive structures 50a.

Figure 5C:
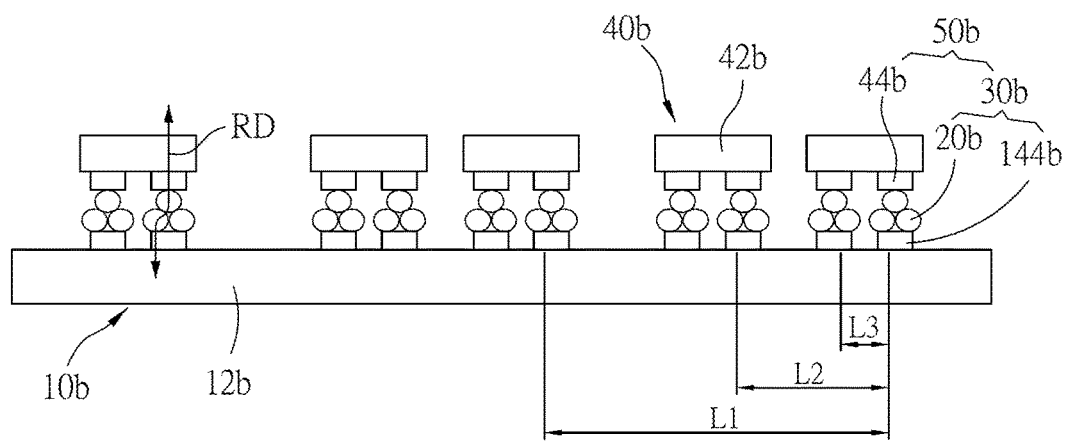
FIG. 5C is a schematic diagram showing still another aspect of the conductive structures disposed on the target circuit substrate according to a first embodiment of this disclosure, which is corresponding to FIG. 3C.

As shown in FIG. 5C in view of FIG. 3B, another structure aspect of the ninth embodiment is disclosed. In this case, this structure aspect can be referred to the aspects of the conductive particles 20a to 20f as shown in FIGS. 3A to 3F. Each micro semiconductor structure 40b is a horizontal-electrode or flip-chip micro LED die. The micro semiconductor structures 40b and the target circuit substrate 10b are combined by thermal pressing, so that a pair of electrodes 44b of each micro semiconductor structure 40b and the corresponding pre-conductive structure 30b of the target circuit substrate 10b can together form a conductive structure 50b as well as a real conductive path RD thereof. Similarly, the first density is greater than the second density. In this embodiment, the first density is far greater than the second density. The conductive particle 20 is not provided between any two of the conductive structures 50b.

Accordingly, the method for forming pre-conductive array on a target circuit substrate of this disclosure is to selectively apply the conductive particles so as to form the pre-conductive array on the target circuit substrate. Then, the micro semiconductor structure and the pre-conductive array of the target circuit substrate are combined by thermal pressing for forming the desired conductive structure array.

In this embodiment, the formation of the pre-conductive array can be arranged and realized by the combination of different numbers of the conductive electrode groups 14, the conductive electrodes 144, and the conductive particles 20. For example, a first number Q1 of conductive electrode groups 14 are provided, each conductive electrode group 14 comprises a second number Q2 of pairs of conductive electrodes 144 (or a second number Q2 of conductive electrodes 144), and each conductive electrode 144 comprises a third number Q3 of conductive particles 20. Alternatively, the formation of the pre-conductive array can be arranged and realized by the combination of different patterns of the conductive electrode groups 14, the conductive electrodes 144, and the conductive particles 20. For example, the conductive electrode groups 14 are distributed in a first array pattern P1, the pairs of conductive electrodes 144 (or the conductive electrodes 144) of each conductive electrode group 14 are distributed in a second array pattern P2, and the conductive particles 20 of each conductive electrode 144 are distributed in a third array pattern P3.

To be noted, the conductive particles 20 can be positioned on the conductive electrode 144 by the limiting structure or pre-adhesive (at least a contact layer 80). When the conductive particles 20 are positioned by the pre-adhesive, the conductive particles with lower density or no conductive particle is disposed between any two conductive structures 50b, and a contact layer 80, which is formed by thermal solidification (thermosetting or thermoplastic), is provided therebetween. When the conductive particles 20 are limited by the limiting structure of the conductive electrode 144, the conductive particles with lower density or no conductive particle is disposed between any two conductive structures 50b, and no contact layer 80, which is formed by thermal solidification (thermosetting or thermoplastic), is provided therebetween.

In addition, when the micro semiconductor structure and the target circuit substrate are combined by thermal pressing, the conductive particles 20 are easily shifted, especially in the aspect of FIG. 5C. The configuration of the pre-adhesive (at least a contact layer 80) can further limit the shift of the conductive particles 20 during the thermosetting or thermoplastic process, thereby making the alignment more precise. Of course, if the limit structure of the conductive electrode 144 can provide the function of limiting the shift of multiple conductive particles 20, the configuration of the pre-adhesive process is not needed.

To be noted, the embodiments of this disclosure can apply the conductive particles according to the requirements of different target circuit substrate, and the conductive particles are not wasted. As mentioned above, in each embodiment of this disclosure, there is no conductive particle configured between any two pre-conductive structures (or any two conductive structures). However, with considering the preciseness of apparatuses or the possible design around this disclosure, the structure of "there is no conductive particle configured between any two pre-conductive structures (or any two conductive structures)" should comprise the following equivalent structure of: a first density is defined to represent a number of the conductive particles within a unit area of each pre-conductive structure (or each conductive structure), a second density is defined to represent a number of the conductive particles within a unit area between two pre-conductive structures (or two conductive structures), and the first density is greater than the second density. As mentioned above, the technical solution of this disclosure comprises, for example but not limited to, the following functions of:

1. The disclosure can match in preciseness with the selection and application of the ultra-thin, fragile and/or small devices, so that it can be widely applied to various scales of electronic devices to be positioned on the target circuit substrate.

2. This disclosure can form the desired pre-conductive array based on the requirements of different target circuit substrate, thereby improving the conducting preciseness and benefiting the customizing products.

3. The disclosure can effectively form the pre-conductive array, which can avoid the waste of conductive particles in the conventional anisotropic conductive paste (ACP), thereby providing an additional option of manufacturing process with higher flexibility and lower cost.

4. This disclosure can provide a pre-adhesive process for preventing the shift of conductive particles during the thermal pressing process of the micro semiconductor structure and the target circuit substrate.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A pre-conductive array disposed on a target circuit substrate, comprising:
   a plurality of conductive electrode groups disposed on the target circuit substrate, wherein a first distance is provided between every two of the conductive electrode groups, and each of the conductive electrode groups comprises at least a pair of conductive electrodes; and
   at least a conductive particle dispose on each of the conductive electrodes of a part or all of the conductive electrode groups;
   wherein the conductive particle and the corresponding pair of the conductive electrodes form a pre-conductive structure, and the pre-conductive structures form the pre-conductive array;
   wherein a first density is defined to represent a number of the conductive particles within a unit area of each of the pre-conductive structures, a second density is defined to represent a number of the conductive particles within a unit area between two of the pre-conductive structures, and the first density is greater than the second density.

2. The pre-conductive array according to claim 1, wherein:
   each of the conductive electrode groups comprises multiple pairs of conductive electrodes, a second distance is provided between adjacent two pairs of the conductive electrodes, and a third distance is provided between two of the conductive electrodes of each pair.

3. The pre-conductive array according to claim 1, wherein:
   a third distance is provided between two of the conductive electrodes of each pair.

4. The pre-conductive array according to claim 1, wherein:
   each of the pre-conductive structures comprises a plurality of conductive particles, and the conductive particles form at least a pre-conductive path.

5. The pre-conductive array according to claim 1, further comprising:
   at least a contact layer disposed on the target circuit substrate, wherein the conductive particles are disposed inside or above the contact layer.

6. A pre-conductive array disposed on a target circuit substrate, comprising:
   a plurality of conductive electrode groups disposed on the target circuit substrate, wherein a first distance is provided between every two of the conductive electrode groups, and each of the conductive electrode groups comprises a conductive electrode; and
   at least a conductive particle disposed on each of the conductive electrodes of a part or all of the conductive electrode groups;
   wherein the conductive particle and the corresponding conductive electrode form a pre-conductive structure, and the pre-conductive structures form the pre-conductive array;
   wherein a first density is defined to represent a number of the conductive particles within a unit area of each of the pre-conductive structures, a second density is defined to represent a number of the conductive particles within a unit area between two of the pre-conductive structures, and the first density is greater than the second density.

7. The pre-conductive array according to claim 6, wherein:
   each of the pre-conductive structures comprises a plurality of conductive particles, and the conductive particles form at least a pre-conductive path.

8. The pre-conductive array according to claim 6, further comprising:
   at least a contact layer disposed on the target circuit substrate, wherein the conductive particles are disposed inside or above the contact layer.

9. A pre-conductive array disposed on a target circuit substrate, comprising:
   a plurality of pre-conductive structures disposed on the target circuit substrate, each of the pre-conductive structures comprising:
   a plurality of conductive electrode groups disposed on the target circuit substrate, wherein each of the pre-conductive structures comprises a first number of the conductive electrode groups, each of the conductive electrode groups comprises at least a pair of conductive electrodes, and each of the conductive electrode groups comprises a second number of the conductive electrodes; and at least a conductive particle disposed on each of the conductive electrodes of a part or all of the conductive electrode groups, wherein each of the pre-conductive structures comprises a third number of the conductive particles;

wherein a first density is defined to represent a number of the conductive particles within a unit area of each of the pre-conductive structures, a second density is defined to represent a number of the conductive particles within a unit area between two of the pre-conductive structures, and the first density is greater than the second density.

10. A pre-conductive array disposed on a target circuit substrate, comprising:

a plurality of pre-conductive structures disposed on the target circuit substrate, each of the pre-conductive structures comprising:

a plurality of conductive electrode groups disposed on the target circuit substrate, wherein each of the pre-conductive structures comprises a first number of the conductive electrode groups, each of the conductive electrode groups comprises at least a conductive electrode, and each of the conductive electrode groups comprises a second number of the conductive electrodes; and at least a conductive particle disposed on each of the conductive electrodes of a part or all of the conductive electrode groups, wherein each of the pre-conductive structures comprises a third number of the conductive particles;

wherein a first density is defined to represent a number of the conductive particles within a unit area of each of the pre-conductive structures, a second density is defined to represent a number of the conductive particles within a unit area between two of the pre-conductive structures, and the first density is greater than the second density.

11. A pre-conductive array disposed on a target circuit substrate, comprising:

a plurality of pre-conductive structures disposed on the target circuit substrate, each of the pre-conductive structures comprising:

a plurality of conductive electrode groups disposed on the target circuit substrate and distributed in a first array pattern, wherein each of the conductive electrode groups comprises at least a pair of conductive electrodes distributed in a second array pattern; and at least a conductive particle disposed on each of the conductive electrodes of a part or all of the conductive electrode groups, wherein the conductive particles are distributed in a third array pattern;

wherein a first density is defined to represent a number of the conductive particles within a unit area of each of the pre-conductive structures, a second density is defined to represent a number of the conductive particles within a unit area between two of the pre-conductive structures, and the first density is greater than the second density.

12. A pre-conductive array disposed on a target circuit substrate, comprising:

a plurality of pre-conductive structures disposed on the target circuit substrate, each of the pre-conductive structures comprising:

a plurality of conductive electrode groups disposed on the target circuit substrate and distributed in a first array pattern, wherein each of the conductive electrode groups comprises at least a conductive electrode distributed in a second array pattern; and at least a conductive particle disposed on each of the conductive electrodes of a part or all of the conductive electrode groups, wherein the conductive particles are distributed in a third array pattern;

wherein a first density is defined to represent a number of the conductive particles within a unit area of each of the pre-conductive structures, a second density is defined to represent a number of the conductive particles within a unit area between two of the pre-conductive structures, and the first density is greater than the second density.

13. A conductive structure array of a target circuit substrate, comprising:

a pre-conductive array applied to the target circuit substrate; and array-type micro semiconductor structures disposed corresponding to a part or all of the pre-conductive array of the target circuit substrate, wherein each of the micro semiconductor structures has a pair of electrodes, and each of the electrodes of each of the micro semiconductor structures and the corresponding pre-conductive structure of the target circuit substrate together form a conductive structure;

wherein a first density is defined to represent a number of conductive particles within a unit area of each of the conductive structures, a second density is defined to represent a number of the conductive particles within a unit area between two of the conductive structures, and the first density is greater than the second density.

14. The conductive structure array according to claim 13, further comprising:

a contact layer disposed between two of the conductive structures by thermal solidification.

15. The conductive structure array according to claim 14, wherein the second density between two of the conductive structures exists in the thermal solidified contact layer.

16. The conductive structure array according to claim 15, wherein the conductive particles do not exist between two of the conductive structures.

17. A conductive structure array of a target circuit substrate, comprising:

a pre-conductive array applied to the target circuit substrate; and array-type micro semiconductor structures disposed corresponding to a part or all of the pre-conductive array of the target circuit substrate, wherein each of the micro semiconductor structures has an electrode, and the electrode of each of the micro semiconductor structures and the corresponding pre-conductive structure of the target circuit substrate together form a conductive structure;

wherein a first density is defined to represent a number of conductive particles within a unit area of each of the conductive structures, a second density is defined to represent a number of the conductive particles within a unit area between two of the conductive structures, and the first density is greater than the second density.

18. The conductive structure array according to claim 17, further comprising:

a contact layer disposed between two of the conductive structures by thermal solidification.

19. The conductive structure array according to claim 18, wherein the second density between two of the conductive structures exists in the thermal solidified contact layer.

20. The conductive structure array according to claim 19, wherein the conductive particles do not exist between two of the conductive structures.

* * * * *